United States Patent [19]

Masami et al.

[11] Patent Number: 4,729,076

[45] Date of Patent: Mar. 1, 1988

[54] SIGNAL LIGHT UNIT HAVING HEAT DISSIPATING FUNCTION

[76] Inventors: Tsuzawa Masami, 14-15 Minamitsukushino 4-chome, Machida-shi, Tokyo; Tominaga Muneharu, 2-47-102, Shiohama 4-chome, Ichikawa-shi, Chiba; Uchiyama Yoshinori, 16-22 Tsurukawa, 3-chome, Machida-shi, Tokyo; Waki Osamu, 1-18, Kitano 1-chome, Mitaka-shi, Tokyo; Kato Hiroshi, 3447, Fukaya, Ayase-shi, Kanagawa; Morikawa Tadahiro, 1184-2, Diagiri, Fujisawa-shi, Kanagawa, all of Japan

[21] Appl. No.: 908,702

[22] PCT Filed: Nov. 15, 1984

[86] PCT No.: PCT/JP84/00548

§ 371 Date: Sep. 15, 1986

§ 102(e) Date: Sep. 15, 1986

[87] PCT Pub. No.: WO86/02985

PCT Pub. Date: May 22, 1986

[51] Int. Cl.$^4$ ............................................. F21V 29/00
[52] U.S. Cl. ................................... 362/235; 362/294; 362/373; 362/800; 340/84; 165/104.33
[58] Field of Search ............... 362/235, 294, 373, 800; 340/84, 22; 165/104.33

[56] References Cited

U.S. PATENT DOCUMENTS

| 2,477,957 | 8/1949 | Briskin | 362/373 X |
| 3,502,858 | 3/1970 | Habro et al. | 362/373 |
| 4,325,146 | 4/1982 | Lennington | 340/636 X |
| 4,419,716 | 12/1983 | Koo | 362/294 X |
| 4,471,415 | 9/1984 | Larson et al. | 362/800 X |
| 4,598,347 | 7/1986 | Peppers | 362/294 X |

FOREIGN PATENT DOCUMENTS

| 0088060 | 9/1983 | European Pat. Off. | 340/84 |
| 3148843 | 6/1983 | Fed. Rep. of Germany | 340/84 |
| 3535204 | 4/1986 | Fed. Rep. of Germany | 340/84 |
| 3438154 | 4/1986 | Fed. Rep. of Germany | 340/84 |
| 472941 | 7/1952 | Italy | 362/373 |
| 2139340 A | 11/1984 | United Kingdom | 362/800 |

Primary Examiner—Albert W. Davis, Jr.
Assistant Examiner—Richard R. Cole
Attorney, Agent, or Firm—John G. Semmes

[57] ABSTRACT

A heat sink, made of a highly heat-conductive material is placed on the back of a circuit board upon the front of which many LEDs are arrayed as the signal light source. The heat sink, generally formed as an aggregate of a number of fins, need not necessarily be fitted in one piece with the back face of the board but may be indirectly connected to the back face of the board with a heat absorber being placed between the heat sink and the back face of the board.

1 Claim, 12 Drawing Figures (A)

(B)

(C)

(D)

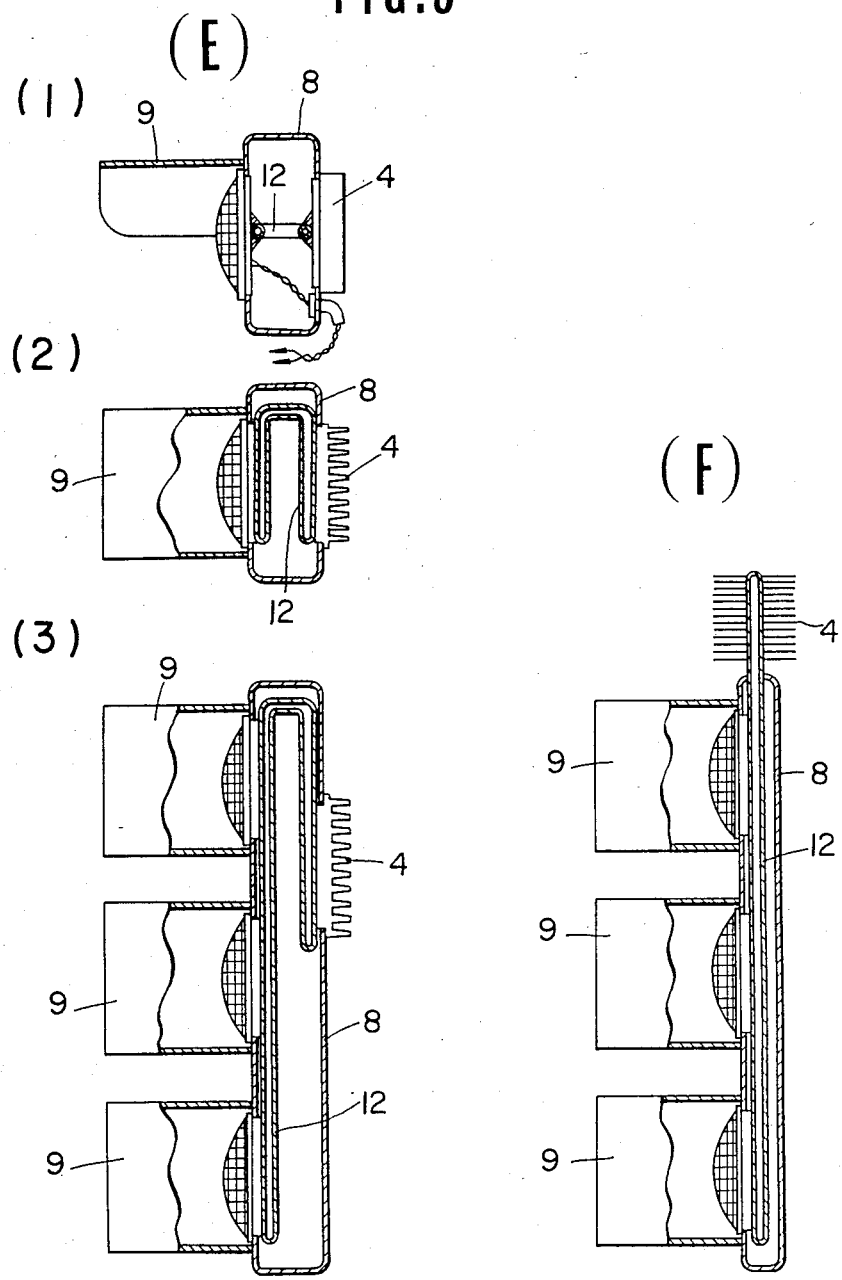

4,729,076

SIGNAL LIGHT UNIT HAVING HEAT DISSIPATING FUNCTION

FIELD OF THE INVENTION

This invention relates to a signal light unit which has a signal light that uses as the light source a number of light-emitting diodes (LEDs) arrayed in the form of a plane and which has a function to effectively dissipate heat of large calorie generated inside the lignt unit.

BACKGROUND OF THE INVENTION

Conventionally, signal lights have been proposed that use as the light source a number of LEDs arrayed in a plane on a board for the purpose of energy saving. LEDs, however, have a low electricity-to-light conversion efficiency and change most of the electricity to heat despite of their high illumination efficiency and energy saving effectiveness. When used collectively in a large number at a time, therefore, LEDs generate a substantially large calorific power. In addition, LEDs have a negative temperature coefficient of light emission, so that their illumination decreases as the ambient temperature rises; for example, the light intensity is halved at an ambient temperature of 80° C. as compared with that at 25° C. To keep a high illumination efficiency of LEDs, therefore, their own temperature must be kept low. The abovementioned conventional signal light which uses many LEDs has such a fault that the LEDs arrayed as many as meet a prescribed illumination standard as the light source generate a substantially large calorific power when they are energized at the same time. As a result, not only the illumination efficiency of the LEDs will lower but also their service life will shorten, thus resulting in a failure as a signal light unit.

This invention solves the problem of such fault with a purpose of providing a signal light unit that has a heat dissipating function that can dissipate effectively the heat generated inside the LEDs to open air through a heat sink located on the back face of the board on the right face of which many LEDs are arrayed in a plane, thus preventing lowering of the light emission efficiency of the LEDs by heat and reverse effects of heat on the signal light.

DISCLOSURE OF THE INVENTION

The signal light unit of this invention comprises heat sink fitted on the back face of a board on the right face of which many LEDs are arrayed as the light source of the signal light. The heat sink efficiently induces and dissipates the heat of LEDs generated in the signal light unit to open air. This type of heat sink is generally formed as an aggregate of many fins. However, it need not always be fitted directly on the back face of the abovementioned board as one piece but can be indirectly connected to the back face with a heat absorber placed between them.

BRIEF DESCRIPTION OF THE DRAWINGS

Referring now to the drawings, there is shown a signal light unit embodying this invention which has a heat dissipating function of this invention.

THE MOST PREFERABLE EMBODIMENT OF THE INVENTION

Figure 1:
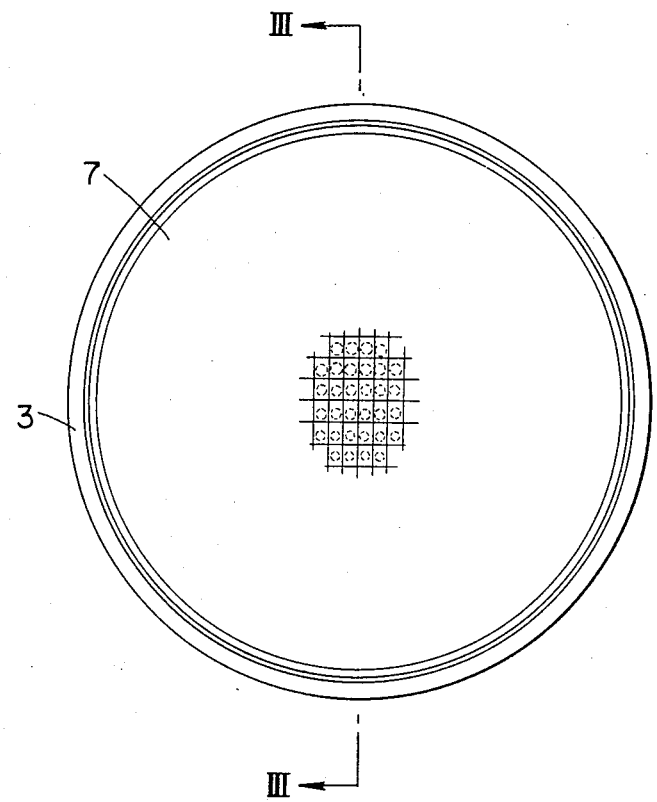
FIG. 1 is a top view,
FIG. 2 a side view,
FIG. 3 a sectional view along lines III—III of FIG. 1,
FIG. 4 a fragmentary enlarged vertical section and a fragmentary enlarged traverse cross section of FIG. 1, and
FIGS. 5A, 5B, 5C, 5D, 5E (1-3), and 5F are different schematic structural representations embodying this invention for use of a signal light unit having a heat dissipating function of this invention as a traffic signal light equipment.
Figure 2:
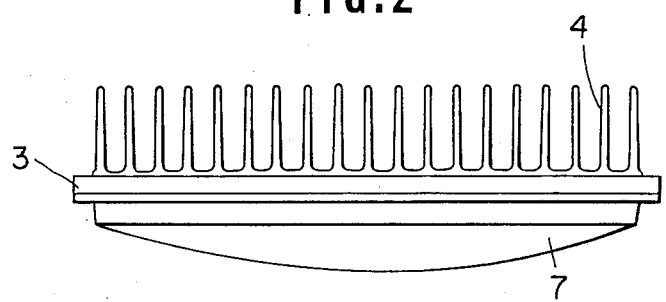
Figure 3:
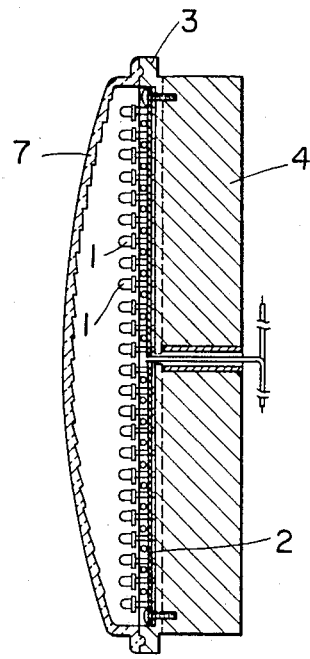
Figure 4:
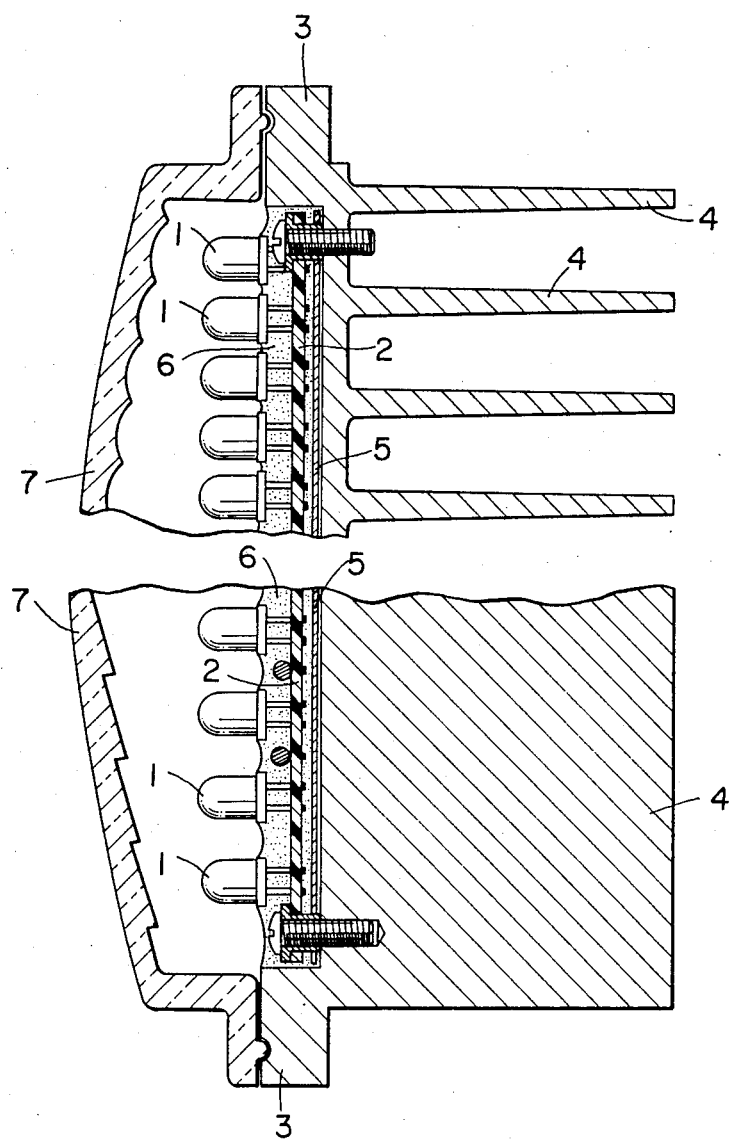

This invention will be better understood from the following description taken in connection with the accompanying drawings.

As shown in FIGS. 1 to 4, part 1 is an LED used as the signal light source, part 2 a printed circuit board (PCB) on which many LEDs 1 are arrayed in a plane and connected electrically, and part 3 a board constructed in one piece with a finned heat sink 4 on its back face. On the right side of board 3, an insulation sheet 5 is fitted, and on the sheet the PCB 2 to which many LEDs 1 are fitted in array is fixed with resin filler 6. Then, on the right face of board 3, a lens 7 is mounted.

The heat generated by LEDs 1 on the right face of board 3 is led to heat sink 4, provided on the whole back face of board 3 so that the heat can be efficiently dissipated from all the surface of the heat sink. Heat sink 4 need not always be placed directly on the back face of board 3 but can, for example, be connected to board 3 through such heat absorber as heat pipes, as described later, or can be constructed in combination with an air blower such as fan for improvement of its heat dissipation effect. Furthermore, heat sink 4 is preferably made of aluminum or any other metal having a good thermal conductivity.

Figure 5:
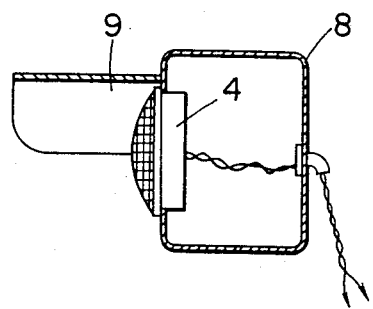
Figure 5:
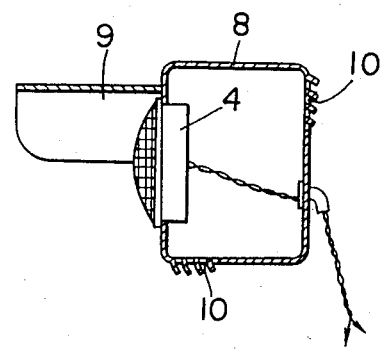
Figure 5:
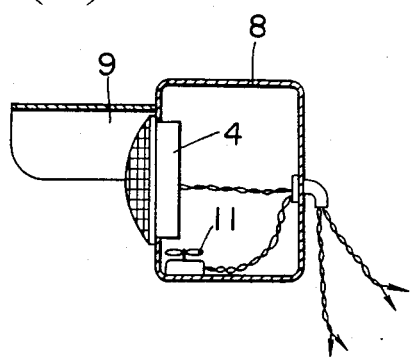
Figure 5:
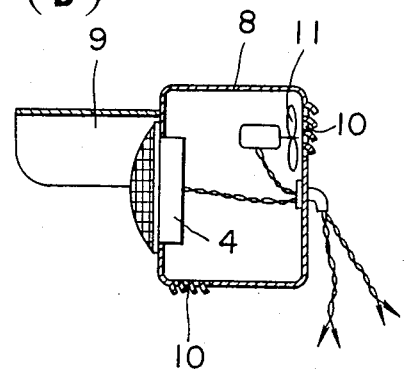

FIG. 5 is an embodiment in which a signal light unit of this invention is used as a traffic signal light. Drawings (A) and (B) in FIG. 5 are another embodiment in which heat sink 4 is formed in one piece with the back face of board 3, the signal light unit of such structure is fitted on the front face of a traffic signal light box 8 and a hood 9 is fixed on the upper outside of light box 8 so that the signal unit in the light box can be cooled by use of heat sink 4. As in drawing (B), the ventilation effect of light box 8 can be improved by means of draft holes 10 provided on the back side of the box.

Drawings (C) and (D) show the structure in which an air blower as fan is used to send air to heat sink 4 in order to improve the heat dissipation effect; drawing (C) is of a method of directly sending air from blower 11 to heat sink 4, while drawing (D) is of a method of sending air from blower 11 to heat sink 4 through draft holes 10 made in light box 8 to improve convection of air in the box. Those four methods of drawings (A) through (D) are preferable when the light emitting part comprising LEDs 1 generates large calorific power or when heat sink 4 is rather small as compared with the light emitting part.

Drawings (E) and (F) show the structure in which heat sink 4 is, separately from the back face of board 3, placed on the outside or outer surface of light box 8 to be exposed to open air and indirectly connected to the back face of board 3 with heat absorber 12, such as of heat pipes, placed between heat sink 4 and board 3, so that a separation between the heat absorbing part and the heat dissipating part will make easy heat insulation or setting of temperature difference for higher heat dissipation effects. Further, in traffic signal light equipment having two or more signal light units, the heat generated by the light units can be, as shown in (3) of drawing (E), gathered into heat absorber 12 common to the light units, and it is also possible to locate heat sink 4 outside light box 8 with the aim of size reduction.

INDUSTRIAL APPLICATIONS

As mentioned above, the signal light unit having a heat dissipating function of this invention is suitable for small-sized energy-saving traffic signal light equipment to be introduced in place of the conventional traffic signal light equipment that is generally installed along the road and which employs incandescent lamps as its light source.

What is claimed is:

1. A signal light box unit having a heat dissipating function which comprises
   (A) a circuit board;
   (B) plural LEDs arrayed upon a front face of the circuit board;
   (C) a finned heat sink disposed upon an outside rear surface of the light box, said heat sink being indirectly connected to the back face of the board;
   (D) a heat absorber, interposed between the said heat sink and back face of said board.

* * * * *